United States Patent
Adachi et al.

(10) Patent No.: US 10,388,821 B2
(45) Date of Patent: Aug. 20, 2019

(54) METHOD FOR MANUFACTURING CRYSTALLINE SILICON-BASED SOLAR CELL AND METHOD FOR MANUFACTURING CRYSTALLINE SILICON-BASED SOLAR CELL MODULE

(71) Applicant: Kaneka Corporation, Osaka (JP)

(72) Inventors: Daisuke Adachi, Osaka (JP); Toru Terashita, Osaka (JP); Toshihiko Uto, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 15/971,744

(22) Filed: May 4, 2018

(65) Prior Publication Data

US 2018/0254375 A1    Sep. 6, 2018

Related U.S. Application Data

(63) Continuation of application No. PCT/JP2016/082868, filed on Nov. 4, 2016.

(30) Foreign Application Priority Data

Nov. 4, 2015 (JP) ................ 2015-217028

(51) Int. Cl.
*H01L 31/18* (2006.01)
*H01L 21/288* (2006.01)
(Continued)

(52) U.S. Cl.
CPC ........ *H01L 31/1884* (2013.01); *H01L 21/288* (2013.01); *H01L 31/0224* (2013.01);
(Continued)

(58) Field of Classification Search
CPC ............... H01L 31/1884; H01L 21/288; H01L 31/0224; H01L 31/022441; H01L 31/022475
(Continued)

(56) References Cited

U.S. PATENT DOCUMENTS

2010/0029034 A1* 2/2010 Nishimoto ........ H01L 31/02363
438/71
2010/0258177 A1* 10/2010 Ko .................... H01L 31/02168
136/256
(Continued)

FOREIGN PATENT DOCUMENTS

JP    2012-253262 A    12/2012
JP    2014-096459 A    5/2014
(Continued)

OTHER PUBLICATIONS

International Search Report issued in International Application No. PCT/JP2016/082868, dated Feb. 7, 2017 (2 pages).
(Continued)

*Primary Examiner* — Sheikh Maruf
(74) *Attorney, Agent, or Firm* — Osha Liang LLP

(57) ABSTRACT

A method for manufacturing a crystalline silicon-based solar cell includes forming a first intrinsic silicon-based thin-film on a first principal surface and a lateral surface of an n-type crystalline silicon substrate, forming a p-type silicon-based thin-film on the first intrinsic silicon-based thin-film, forming a first transparent electrode layer on an entire region of the first principal surface except for a peripheral portion, forming a second intrinsic silicon-based thin-film on a second principal surface and the lateral surface of the n-type crystalline silicon substrate, forming an n-type silicon-based thin-film on the second intrinsic silicon-based thin-film, forming a second transparent electrode layer on an entire region of the second principal surface and the lateral surface
(Continued)

of the n-type crystalline silicon substrate, forming a patterned collecting electrode on the first transparent electrode layer, and forming a plated metal electrode on the second transparent electrode layer by an electroplating method.

16 Claims, 6 Drawing Sheets

(51) Int. Cl.
    *H01L 31/0224* (2006.01)
    *H01L 31/0747* (2012.01)
    *H01L 31/0236* (2006.01)
    *H01L 31/20* (2006.01)

(52) U.S. Cl.
    CPC .......... *H01L 31/02363* (2013.01); *H01L 31/022441* (2013.01); *H01L 31/022475* (2013.01); *H01L 31/0747* (2013.01); *H01L 31/202* (2013.01); *Y02E 10/50* (2013.01); *Y02P 70/521* (2015.11)

(58) Field of Classification Search
    USPC .................................................... 438/71, 72
    See application file for complete search history.

(56) References Cited

U.S. PATENT DOCUMENTS

| | | | | |
|---|---|---|---|---|
| 2011/0045627 A1* | 2/2011 | Sachs | ............ | H01L 31/022425 438/71 |
| 2011/0143484 A1* | 6/2011 | Lin | .................. | H01L 31/02168 438/72 |
| 2011/0240997 A1* | 10/2011 | Rockenberger | ..... | H01L 21/0237 257/49 |
| 2011/0315190 A1* | 12/2011 | Yoshikawa | ......... | H01L 31/0465 136/244 |
| 2011/0316145 A1* | 12/2011 | Tsao | ...................... | B82Y 40/00 257/734 |
| 2012/0024365 A1* | 2/2012 | Branz | ................ | F24D 11/0221 136/256 |
| 2012/0178204 A1* | 7/2012 | Toor | .................. | H01L 31/02363 438/71 |
| 2012/0225517 A1* | 9/2012 | Zhang | ............... | H01L 31/02366 438/71 |
| 2012/0240998 A1* | 9/2012 | Ballif | .............. | H01L 31/022425 136/256 |
| 2012/0291844 A1* | 11/2012 | Tsuge | .............. | H01L 31/022425 136/244 |
| 2013/0312827 A1* | 11/2013 | Adachi | .......... | H01L 31/022425 136/256 |
| 2014/0162394 A1 | 6/2014 | Kai et al. | | |
| 2015/0075601 A1 | 3/2015 | Adachi et al. | | |
| 2015/0270422 A1 | 9/2015 | Uzu et al. | | |
| 2016/0133779 A1 | 5/2016 | Adachi et al. | | |
| 2016/0308079 A1 | 10/2016 | Adachi et al. | | |

FOREIGN PATENT DOCUMENTS

| | | |
|---|---|---|
| JP | 2014-232818 A | 12/2014 |
| JP | 2014-241392 A | 12/2014 |
| JP | 2015-082603 A | 4/2015 |
| JP | 5694620 B1 | 4/2015 |
| JP | 2015-159198 A | 9/2015 |
| WO | 2013/161127 A1 | 10/2013 |
| WO | 2015/064634 A1 | 5/2015 |

OTHER PUBLICATIONS

International Preliminary Report on Patentability issued in International Application No. PCT/JP2016/082868; dated May 17, 2018 (6 pages).

* cited by examiner

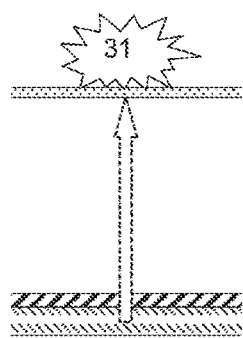
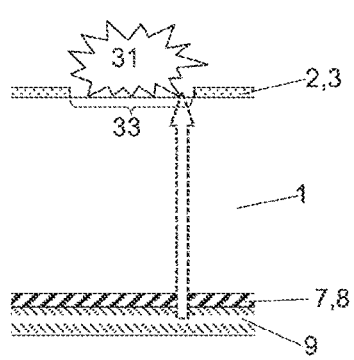
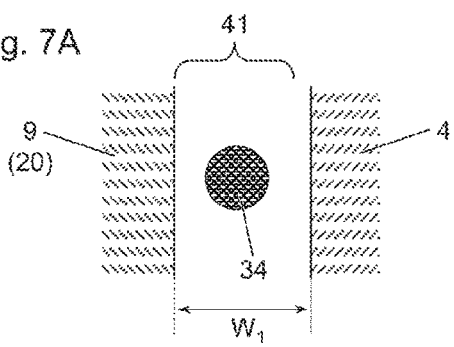
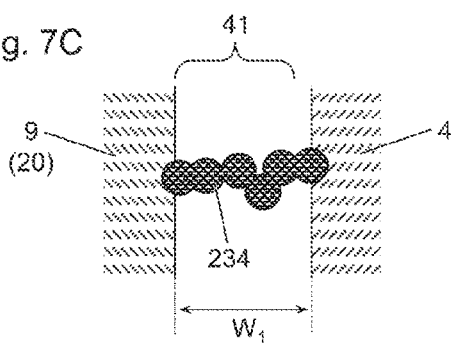
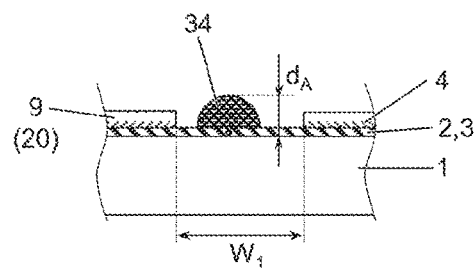
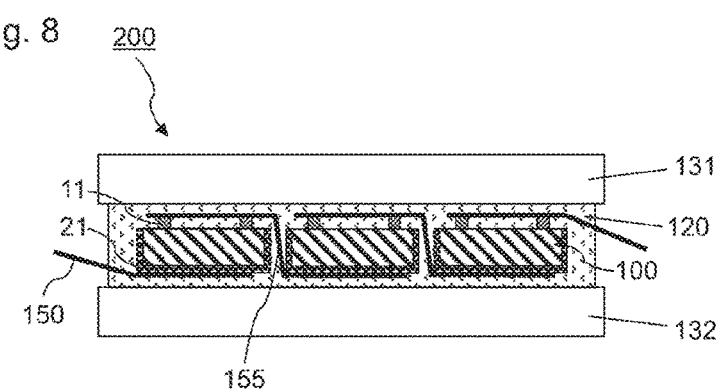

US 10,388,821 B2

METHOD FOR MANUFACTURING CRYSTALLINE SILICON-BASED SOLAR CELL AND METHOD FOR MANUFACTURING CRYSTALLINE SILICON-BASED SOLAR CELL MODULE

TECHNICAL FIELD

One or more embodiments of the present invention relate to a method for manufacturing crystalline silicon-based solar cell and a method for manufacturing crystalline silicon-based solar cell module.

BACKGROUND

A crystalline silicon-based solar cell including a conductive silicon-based thin-film on a single-crystalline silicon substrate is called a heterojunction solar cell. Particularly, a heterojunction solar cell including an intrinsic amorphous silicon thin-film between a conductive silicon-based thin-film and a crystalline silicon substrate is known as one of forms of crystalline silicon-based solar cells having the highest conversion efficiency.

A heterojunction solar cell includes silicon-based thin-film of opposite-conductivity-type on the light-receiving side of a crystalline silicon substrate of first conductivity-type, and silicon-based thin-film of first conductivity-type on the back side of the crystalline silicon substrate of first conductivity-type. Generally, an n-type crystalline silicon substrate is used, and a p-type silicon-based thin-film is formed on the light-receiving side thereof, while an n-type silicon-based thin-film is formed on the back side thereof. Carriers generated at these semiconductor junction portions are extracted outside of a solar cell via an electrode. As the electrode, a combination of a transparent electrode layer and a metal collecting electrode is generally used.

As described in Patent Document 2, deposition of a silicon-based thin-film is generally performed by mounting a plurality of silicon substrates on a plate-shape tray. Particularly when a mask or the like is not used in deposition, the transparent electrode layer is also deposited on the lateral surface of a silicon substrate or on a side opposite to a major deposition surface of the silicon substrate by wraparound, so that a short circuit occurs between the front and the back. Patent Document 1 suggests that when a front-side transparent electrode layer is formed with a mask disposed on the peripheral end of a silicon substrate, a short circuit between the front and the back can be prevented because the transparent electrode layer is not formed on the peripheral end of the silicon substrate.

Since the metal collecting electrode shields light, a line-shape patterned metal collecting electrode is used on the light-receiving side for enlarging the light-receiving area of the solar cell. For example, Patent Document 3 discloses a heterojunction solar cell in which a metal electrode is formed by electroplating. In electroplating, a metal electrode having a large thickness can be easily formed, and therefore improvement of characteristics and productivity by reduction of the resistance of the metal electrode can be expected.

PRIOR ART DOCUMENT

Patent Documents

Patent document 1: WO 2015/064634
Patent document 2: JP A 2012-253262
Patent document 3: WO 2013/161127

As disclosed in Patent Document 1, in production of a heterojunction solar cell, a silicon-based thin-film and a transparent electrode layer are also deposited on the lateral surface and a surface opposite to a deposition surface of a silicon substrate by wraparound, so that a short-circuit between transparent electrodes on the front and the back generates. When a metal electrode is formed on the back side by electroplating in a state in which the electrodes on front and back are short-circuited, a metal layer is also precipitated on the light-receiving side to generate a new leakage pass, a shading loss and so on. Thus, it is necessary to form an insulating region for eliminating a short-circuit between transparent electrode layers on the front and the back before forming a metal electrode by electroplating.

The present inventors have conducted studies, and found that when a metal electrode is formed on the back side of a heterojunction solar cell by a plating method, a metal component is diffused from a plating solution into a silicon substrate, or an undesired metal is precipitated due to leakage which is not associated with a short-circuit between transparent electrode layers on the front and the back, and these cannot be solved merely by eliminating a short-circuit between transparent electrode layers on the front and the back. It has become evident that particularly in formation of a metal electrode by a plating method, transparent electrode layers on the front and the back are short-circuited by a metal electrode material generated in an insulating region, leading to deterioration of the performance of a solar cell.

SUMMARY

One or more embodiments of the present invention relate to improve the productivity and conversion efficiency of a solar cell by forming a back metal electrode using an electroplating method capable of reducing a process cost; and suppressing precipitation of an undesired metal, diffusion of a metal into a silicon substrate, and so on.

One or more embodiments of the present invention are a method for manufacturing a crystalline silicon-based solar cell of the following. The crystalline silicon-based solar cell includes: an n-type crystalline silicon substrate having a first principal surface and a second principal surface; a first intrinsic silicon-based thin-film, a p-type silicon-based thin-film, a first transparent electrode layer, a patterned collecting electrode and a wiring member arranged in this order on the first principal surface of the n-type crystalline silicon substrate; and a second intrinsic silicon-based thin-film, an n-type silicon-based thin-film, a second transparent electrode layer and a plated metal electrode arranged in this order on the second principal surface of the n-type crystalline silicon substrate. An insulating region that is freed from a short circuit between the first transparent electrode layer and the second transparent electrode layer exists on the peripheral portion of the first principal surface of the n-type crystalline silicon substrate. The method includes a first intrinsic silicon-based thin-film forming step of forming the first intrinsic silicon-based thin-film on the first principal surface and a lateral surface of the n-type crystalline silicon substrate; a p-type silicon-based thin-film forming step of forming the p-type silicon-based thin-film on the first intrinsic silicon-based thin-film; a first transparent electrode layer forming step of forming the first transparent electrode layer on the entire region on the first principal surface side of the n-type crystalline silicon substrate except for the peripheral portion; a second intrinsic silicon-based thin-film forming step of depositing the second intrinsic silicon-based thin-film on the second principal surface and a lateral surface of the n-type crystalline silicon substrate; an n-type silicon-based thin-film forming step of forming the n-type silicon-based thin-film on the second intrinsic silicon-based thin-film; a second transparent electrode layer forming step of depositing the second transparent electrode layer on the entire second principal surface side and a lateral surface of the n-type crystalline silicon substrate; a patterned collecting electrode forming step of forming the patterned collecting electrode on the first transparent electrode layer; and a plated metal electrode forming step of forming the plated metal electrode on the second transparent electrode layer by an electroplating method in a state in which the insulating region is provided on the peripheral portion of the first principal surface of the n-type crystalline silicon substrate. The second intrinsic silicon-based thin-film forming step is carried out after the first intrinsic silicon-based thin-film forming step.

When a plated metal region composed of a material of the plated metal electrode is formed in the form of islands on the insulating region in the plated metal electrode forming step, it is preferable the following relationships are satisfied: $d_2<d_1$; and $d_A<d_1$, where $d_1$, $d_2$ and $d_A$ are a thickness of the patterned collecting electrode, a thickness of the plated metal electrode and a thickness of the plated metal region, respectively; and $2d_A<W_1$, where $W_1$ is a width of the insulating region. A method for manufacturing a crystalline silicon-based solar cell module according to one or more embodiments of the present invention includes a wiring member mounting step of mounting a wiring member on the patterned collecting electrode of the solar cell. The wiring member is mounted on the patterned collecting electrode, and also disposed over the insulating region separately from the plated metal region in the wiring member mounting step.

Preferably the n-type silicon-based thin-film forming step is carried out after the p-type silicon-based thin-film forming step.

Preferably the method further includes a first insulating layer forming step of forming a first insulating layer on at least a region of the first transparent electrode layer where the patterned collecting electrode is not disposed.

It is preferable that in the first transparent electrode layer forming step, deposition is performed in a state in which a mask is disposed on the peripheral portion of the first principal surface of the n-type crystalline silicon substrate, thereby the first transparent electrode layer is formed on the entire region on the first principal surface side of the n-type crystalline silicon substrate except for the peripheral portion.

Preferably, the second transparent electrode layer is formed on the entire second principal surface and a lateral surface of the n-type crystalline silicon substrate by performing deposition without using a mask in the second transparent electrode layer forming step.

It is preferable that in the p-type silicon-based thin-film forming step, the p-type silicon-based thin-film is formed on the entire first principal surface and a lateral surface of the n-type crystalline silicon substrate by performing deposition without using a mask, and in the n-type silicon-based thin-film forming step, the n-type silicon-based thin-film is formed on the entire second principal surface and a lateral surface of the n-type crystalline silicon substrate by performing deposition without using a mask.

Preferably the method further includes a plating base electrode forming step of forming a plating base electrode on the second transparent electrode layer after the second transparent electrode layer forming step and before the plated metal electrode forming step, and the plated metal electrode is formed on the plating base electrode in the plated metal electrode forming step.

Preferably the plated metal electrode is formed by feeding electricity onto the plating base electrode in the plated metal electrode forming step.

Preferably, the patterned collecting electrode includes a patterned plating collecting electrode, and the patterned plating collecting electrode is formed in the plated metal electrode forming step.

Preferably the patterned plating collecting electrode on the first principal surface side of the n-type crystalline silicon substrate and the plated metal electrode on the second principal surface side of the n-type crystalline silicon substrate are formed simultaneously in the plated metal electrode forming step.

Preferably the patterned collecting electrode further includes a base electrode, a first insulating layer is formed so as to cover a part of the base electrode and the first transparent electrode layer in the first insulating layer forming step; and a patterned plating collecting electrode is formed on the base electrode through an opening of the first insulating layer on the base electrode in the plated metal electrode forming step.

Preferably the method further includes a texture forming step of forming a texture on a surface of the n-type crystalline silicon substrate, and the surface of the texture is cleaned before the first intrinsic silicon-based thin-film forming step and before the second intrinsic silicon-based thin-film forming step.

Preferably the n-type crystalline silicon substrate having the texture is cleaned by using ozone water in the texture forming step.

In one or more embodiments of the present invention, a back metal electrode (plated metal electrode) is formed by an electroplating method, and therefore the electrode can be easily formed with a large thickness. In addition, electroplating is performed in a state where a specific insulating region exists, and therefore precipitation of an undesirable metal, diffusion of a metal into a silicon substrate, and the like are suppressed. Further, generation of a leakage current due to contact between a wiring member and the plated metal region can be suppressed even if a metal electrode material is precipitated to form a plated metal region on insulating region. Thus, according to one or more embodiments of the present invention, productivity and conversion efficiency of a solar cell and a solar cell module can be improved.

BRIEF DESCRIPTION OF THE DRAWINGS

FIGS. 6A and 6B are conceptual views each showing a state in the vicinity of the peripheral portion of a substrate in a process for depositing a silicon-based thin-film.

FIGS. 7A to 7C are conceptual views each showing a shape of a plated metal region.

FIG. 8 is a schematic sectional view of a crystalline silicon-based solar cell module.

DETAILED DESCRIPTION OF THE EMBODIMENTS

Figure 1:
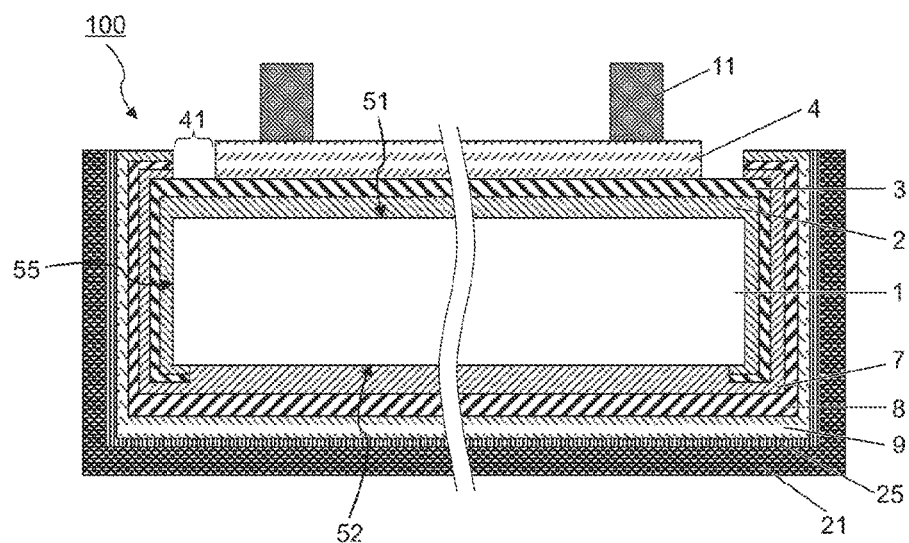
FIG. 1 is a schematic sectional view showing one mode of a crystalline silicon-based solar cell

FIG. 1 is a schematic sectional view of a crystalline silicon-based solar cell 100. An n-type crystalline silicon substrate 1 is used in the crystalline silicon-based solar cell 100. The n-type crystalline silicon substrate 1 has first principal surface 51, second principal surface 52 and lateral surface 55. The crystalline silicon-based solar cell 100 includes a first intrinsic silicon-based thin-film 2, a p-type silicon-based thin-film 3, a first transparent electrode layer 4 and a patterned collecting electrode 11 on the first principal surface 51 of the n-type crystalline silicon substrate 1; and a second intrinsic silicon-based thin-film 7, an n-type silicon-based thin-film 8, a second transparent electrode layer 9 and a plated metal electrode 21 on the second principal surface 52 of the n-type crystalline silicon substrate 1.

The solar cell 100 has on the peripheral portion of the first principal surface of the n-type crystalline silicon substrate 1 an insulating region 41 on which neither first transparent electrode layer 4 nor second transparent electrode layer 9 is formed. In this specification, the "peripheral end" of the principal surface refers to an end edge of the principal surface. The "peripheral portion" refers to a peripheral end and a region extending over a predetermined distance (several tens μm to several mm) from the peripheral end.

An outline of a manufacturing method of one or more embodiments of the present invention will be described with reference to FIGS. 2A to 2J.

Figure 2A:
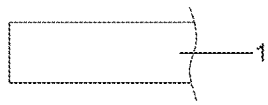
FIGS. 2A to 2J are conceptual views showing a process for manufacturing a crystalline silicon-based solar cell module.

First, as shown in FIG. 2A, an n-type crystalline silicon substrate 1 is provided.

Figure 2B:
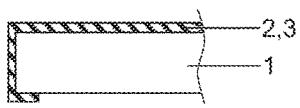
Figure 2C:
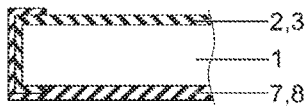

Next, as shown in FIGS. 2B and 2C, the first intrinsic silicon-based thin-film 2 is formed on the entire region of the first principal surface 51 and a lateral surface of the n-type crystalline silicon substrate 1 (first intrinsic silicon-based thin-film forming step), the p-type silicon-based thin-film 3 is formed on the first intrinsic silicon-based thin-film 2 (p-type silicon-based thin-film forming step), the second intrinsic silicon-based thin-film 7 is formed on the entire region of the second principal surface 52 and a lateral surface of the n-type crystalline silicon substrate 1 (second intrinsic silicon-based thin-film forming step), and the n-type silicon-based thin-film 8 is formed on the second intrinsic silicon-based thin-film (n-type silicon-based thin-film forming step).

For the order of forming these silicon-based thin-films, the second intrinsic silicon-based thin-film 7 may be deposited after formation of the first intrinsic silicon-based thin-film 2. In particular, it is preferable that the first intrinsic silicon-based thin-film 2, the p-type silicon-based thin-film 3, the second intrinsic silicon-based thin-film 7 and the n-type silicon-based thin-film 8 are formed in this order as shown in FIGS. 2B and 2C.

Figure 2D:
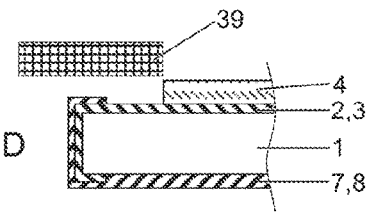
Figure 2E:
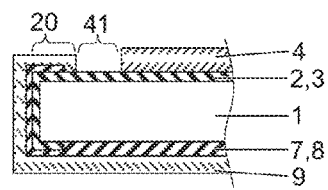

Subsequently, the first transparent electrode layer 4 is formed in the entire region on the first principal surface side of the n-type crystalline silicon substrate 1 except for the peripheral portion (first transparent electrode layer forming step) as shown in FIG. 2D, and the second transparent electrode layer 9 is deposited on the entire second principal surface side of the n-type crystalline silicon substrate 1 (second transparent electrode layer forming step) as shown in FIG. 2E. When a thin-film such as a silicon-based thin-film or a transparent electrode layer is deposited without using a mask, the thin-film is also formed on a lateral surface and a peripheral end of an opposite principal surface by wraparound. For example, the second transparent electrode layer 9 is deposited on the lateral surface 55 and the first principal surface 51 of the n-type crystalline silicon substrate 1 by wraparound, and as shown in FIG. 2E, a wraparound portion 20 of the second transparent electrode layer 9 is formed at the peripheral end of the first principal surface and in the vicinity thereof. On the other hand, when deposition is performed with a mask 39 disposed on the peripheral portion including the peripheral end as shown in FIG. 2D, a film is not formed on the peripheral portion of the major deposition surface, and wraparound of the thin-film to the lateral surface and the peripheral end of the opposite principal surface. Thus, by depositing the first transparent electrode layer 4 using a mask, and forming the second transparent electrode layer 9 without using a mask, the peripheral portion of the n-type crystalline silicon substrate 1 on the first principal surface side has an insulating region 41 where neither the first transparent electrode layer 4 nor the second transparent electrode layer 9 is formed.

Figure 2F:
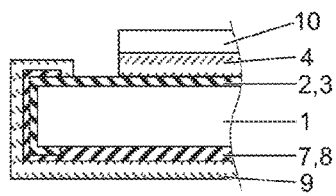

Further, it is preferable that as shown in FIG. 2F, the first insulating layer 10 be formed on the first transparent electrode layer 4 (first insulating layer forming step) after formation of the first transparent electrode layer 4.

Figure 2G:
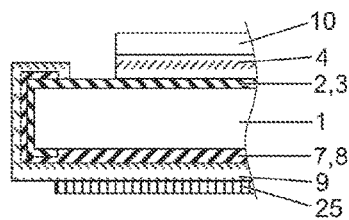
Figure 2H:
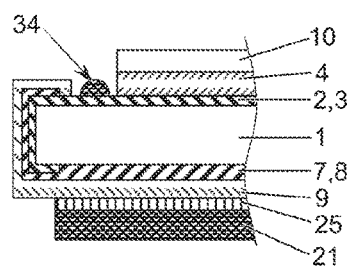

As shown in FIG. 2H, the plated metal electrode 21 is formed on the second transparent electrode layer 9 by an electroplating method (plated metal electrode forming step). As will be described later, a plated metal region 34 composed of a material of the plated metal electrode may be formed in the form of islands in the insulating region 41 in this plated metal electrode forming step. Preferably, a plating base electrode 25 is formed on the second transparent electrode layer 9 (plating base electrode forming step), and the plated metal electrode 21 is formed on the plating base electrode 25 as shown in FIG. 2G.

Figure 2I:
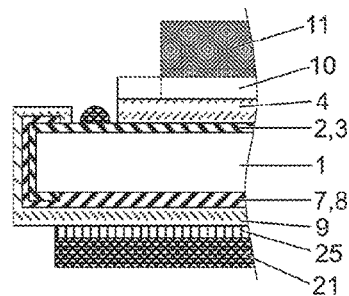

As shown in FIG. 2I, the patterned collecting electrode 11 is formed on a first principal surface 51 of the n-type crystalline silicon substrate 1.

Figure 2J:
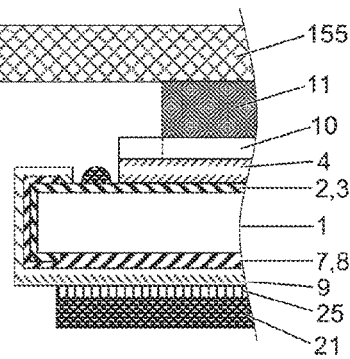

Through the above steps, the crystalline silicon-based solar cell 100 is manufactured. Further, as shown in FIG. 2J, a wiring member is mounted onto the patterned collecting electrode (wiring member mounting step) to form a crystalline silicon-based solar cell module.

Hereinafter, a method for manufacturing the crystalline silicon-based solar cell module will be described more in detail.

In comparison between holes and electrons, electrons have a smaller effective mass and scattering cross-sectional area, and thus have a larger mobility. Therefore, an n-type crystalline silicon substrate 1 is used as the crystalline silicon substrate. In the heterojunction solar cell, a strong electric field can be provided to efficiently separate and collect electron-hole pairs when the heterojunction on the light-receiving side, at which light incident to the crystalline silicon substrate is absorbed in the largest amount, is a reverse junction. Thus, when the first principal surface of the n-type crystalline silicon substrate 1 provided with the p-type silicon-based thin-film 3 is a light-receiving surface, conversion efficiency is improved.

(Texture Forming Step)

Preferably a texture (morphology structure) is formed on a surface of the n-type crystalline silicon substrate 1. By forming the texture, reflection of light is reduced, so that the amount of light introduced into the solar cell 100 is increased, and therefore the power generation of the solar cell module can be improved. For forming textures on the surface, it is possible that the n-type crystalline silicon substrate be cut so as to have the (100) surface as an incident surface. On the n-type crystalline silicon substrate cut along the (100) surface, textured structures can be easily formed by anisotropic etching which makes use of a difference between etching rates on the (100) surface and the (111) surface.

Textures can be formed by anisotropic etching in which the n-type crystalline silicon substrate is immersed in an etchant containing an alkali and an additive for anisotropic etching. Examples of the alkali include but are not limited to sodium hydroxide and potassium hydroxide. The additive for anisotropic etching is added for preventing a hydrogen gas, which is produced during reaction in anisotropic etching, from sticking to the n-type crystalline silicon substrate. As the additive for anisotropic etching, one that acts to reduce the surface tension may be used, and examples thereof include but are not limited to alcohols such as isopropyl alcohol (2-propanol), and surfactants.

It is preferable that after the texture is formed on a surface of the n-type crystalline silicon substrate 1, the surface of the substrate is subjected to a cleaning treatment (hereinafter, also referred to as an ozone treatment) using ozone water. Examples of the ozone treatment method include a method in which the n-type crystalline silicon substrate 1 after formation of textures is immersed into 1 to 50 ppm ozone-containing solution, and a method in which an ozone-containing solution is sprayed to a surface of an n-type crystalline silicon substrate 1 after formation of textures. When the ozone concentration is 50 ppm or less, an oxide film formed on a substrate surface does not have an excessively large thickness.

By the ozone treatment, a substrate surface is oxidized to form an oxide film, and impurities (e.g., organic substances such as oil) etc. deposited on the substrate surface are captured in the oxide film. It is possible that after the ozone treatment, the substrate surface be etched for removing the oxide film. For etching of the substrate surface, an aqueous solution containing hydrofluoric acid (HF) may be used. By for example, an etching treatment using hydrofluoric acid, impurities on the substrate surface can be removed together with the oxide film.

(Silicon-Based Thin-Film Formation Step)

On the first principal surface of the n-type crystalline silicon substrate 1, a first intrinsic silicon-based thin-film 2 and a p-type silicon-based thin-film 3 are formed as silicon-based thin-films. On the second principal surface of the n-type crystalline silicon substrate 1, a second intrinsic silicon-based thin-film 7 and an n-type silicon-based thin-film 8 are formed as silicon-based thin-films.

The intrinsic silicon-based thin-films 2 and 7 are preferably i-type hydrogenated amorphous silicon composed of silicon and hydrogen. When i-type hydrogenated amorphous silicon is deposited on a crystalline silicon substrate, surface passivation can be effectively performed while suppressing diffusion of impurities to the crystalline silicon substrate.

The intrinsic silicon-based thin-film is a silicon-based thin-film which does not contain a dopant, or has an extremely low dopant concentration. The extremely low dopant concentration means that the dopant concentration is not more than $1/20$ of the dopant concentration of the p-type silicon-based thin-film 3 or the n-type silicon-based thin-film 8. It is preferable that the intrinsic silicon-based thin-film has a dopant concentration which is not more than $1/100$ of the dopant concentration of the p-type silicon-based thin-film 3 or the n-type silicon-based thin-film 8, and it is more preferable that the intrinsic silicon-based thin-film does not contain a dopant.

On the entire first principal surface, the entire second principal surface and the entire region of the lateral surface of the n-type crystalline silicon substrate 1, at least one of the first intrinsic silicon-based thin-film 2 and the second intrinsic silicon-based thin-film 7 is formed. In other words, the entire surface of the n-type crystalline silicon substrate 1 is covered with a silicon-based thin-film.

According to the method of one or more embodiments of the present invention, the insulating region 41 freed from a short circuit between the first transparent electrode layer 4 and the second transparent electrode layer 9 is formed on the peripheral portion of the first principal surface 51 of the n-type crystalline silicon substrate 1. The entire region means the entirety of a region excluding a very narrow region where at least one of the first intrinsic silicon-based thin-film 2 and the second intrinsic silicon-based thin-film 7 is made absent due to defects based on pinholes, contaminants or the like, or due to a contact of a position fixing tool or the like during deposition.

The conductive (p-type or n-type) silicon-based thin-films 3 and 8 may be amorphous silicon-based thin-films, microcrystalline silicon-based thin-films (thin-films containing amorphous silicon and crystalline silicon), and the like. For the silicon-based thin-film, not only silicon but also a silicon-based alloy such as silicon oxide, silicon carbide or silicon nitride can be used. Among them, the conductive silicon-based thin-film is preferably an amorphous silicon thin-film.

As the method for forming the silicon-based thin-films 2, 3, 7 and 8, a dry process such as a CVD method, a sputtering method or a vapor deposition method is preferred. Among them, a plasma-enhanced CVD method is particularly preferable.

Among the silicon-based thin-films 2, 3, 7 and 8, the first intrinsic silicon-based thin-film 2 is first deposited on the first principal surface 51 of the n-type crystalline silicon substrate. As will be described in detail later, generation of a plated metal on the insulating region 41 in the plated metal electrode forming step can be reduced when deposition of the first intrinsic silicon-based thin-film 2 precedes deposition of the second intrinsic silicon-based thin-film 7. From the viewpoint of improving productivity it is preferable that the first intrinsic silicon-based thin-film 2 and the p-type silicon-based thin-film 3 are formed on the first principal surface of the n-type crystalline silicon substrate 1 using the same deposition apparatus. Similarly it is preferable that the second intrinsic silicon-based thin-film 7 and the n-type silicon-based thin-film 8 are formed on the first principal surface of the n-type crystalline silicon substrate 1 using the same deposition apparatus.

(Transparent Electrode Layer Forming Step)

The first transparent electrode layer 4 and the second transparent electrode layer 9 are formed on conductive silicon-based thin-films 3 and 8, respectively. After deposition of all the silicon-based thin-films 2, 3, 7 and 8, the first transparent electrode layer 4 and the second transparent electrode layer 9 are deposited. When the transparent electrode layers 4 and 9 are deposited after all the silicon-based thin-films 2, 3, 7 and 8 are deposited, a passivation effect on a lateral surface of the crystalline silicon substrate can be made higher as compared to a case where the intrinsic silicon-based thin-film, the conductive silicon-based thin-film and the transparent electrode layer are formed on one principal surface, followed by forming the intrinsic silicon-based thin-film, the conductive silicon-based thin-film and the transparent electrode layer on the other principal surface.

As the method for forming the transparent electrode layers 4 and 9, a dry process such as a CVD method, a sputtering method or a vapor deposition method is preferred. Among them, a physical vapor deposition method such as a sputtering method, a CVD method using a reaction of an organic metal compound with oxygen or water, or the like (MOCVD method) is particularly preferable.

Figure 3:
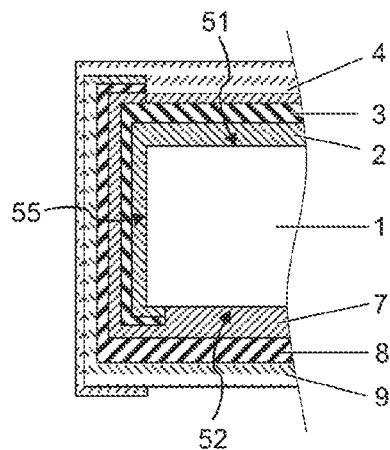
FIG. 3 is a schematic sectional view showing one example of a deposition state in the vicinity of the peripheral portion of a substrate after formation of a silicon-based thin-film and a transparent electrode layer on an n-type crystalline silicon substrate.

FIG. 3 is a sectional view schematically showing a configuration in the vicinity of the peripheral portion of an n-type crystalline silicon substrate 1 when the first intrinsic silicon-based thin-film 2 and the p-type silicon-based thin-film 3 are formed on the first principal surface of the n-type crystalline silicon substrate 1, the second intrinsic silicon-based thin-film 7 and the n-type silicon-based thin-film 8 are then formed on the second principal surface of the n-type crystalline silicon substrate 1, and the second transparent electrode layer 9 and the first transparent electrode layer 4 are then formed without using a mask.

When the above-mentioned layers are formed by a dry process such as a CVD method or a sputtering method without using a mask, the silicon-based thin-films 7 and 8 and the second transparent electrode layer 9 formed on the second principal surface of the n-type crystalline silicon substrate 1 are also formed on the lateral surface of the n-type crystalline silicon substrate 1 and the peripheral portion of the first principal surface by wraparound during deposition. The silicon-based thin-films 2 and 3 and the first transparent electrode layer 4 formed on the first principal surface of the n-type crystalline silicon substrate 1 are also formed on the lateral surface and the peripheral portion of the second principal surface of the silicon substrate 1 by wraparound during deposition. Thus, in the form shown in FIG. 3 the first transparent electrode layer 4 and the second transparent electrode layer 9 are short-circuited with each other.

When the plated metal electrode 21 is formed on the second transparent electrode layer 9 by an electroplating method in a state in which the first transparent electrode layer 4 and the second transparent electrode layer 9 are short-circuited with each other as described above, a metal is precipitated on the first transparent electrode layer 4 on the first principal surface (light-receiving surface) side of the n-type crystalline silicon substrate 1. Thus, it is necessary to form the plated metal electrode on the second principal surface of the n-type crystalline silicon substrate 1 in a state in which the first transparent electrode layer 4 and the second transparent electrode layer 9 are not short-circuited with each other.

In one or more embodiments of the present invention, the plated metal electrode 21 is formed by electroplating in the presence of an insulating region 41 on which neither the first transparent electrode layer 4 nor the second transparent electrode layer 9 is formed. For suppressing precipitation of a metal due to leakage, it is necessary to form at least the first intrinsic silicon-based thin-film 2 and p-type silicon-based thin-film 3 on the insulating region so that the n-type crystalline silicon substrate 1 is not exposed. In manufacturing of a heterojunction solar cell, for example, a method is known in which deposition is performed with a mask disposed on the peripheral portion of a first principal surface of a substrate, so that deposition of the film on the peripheral portion of the first principal surface, a lateral surface and a second principal surface is prevented to ensure that a short circuit on the front and the back does not occur, or in which a short-circuited portion is removed by etching processing or the like. In one or more embodiments of the present invention, it is preferable that a plate-shape mask such as a metal mask is used during formation of the first transparent electrode layer 4 to avoid generation of a short-circuit between the front and the back, since the above-mentioned insulating region can be easily formed.

As the transparent electrode layer, conductive metal oxide such as zinc oxide, indium oxide and tin oxide, or composite metal oxides thereof is used. Among them, indium-based oxides are preferable from the viewpoints of electroconductivity, optical characteristics and long-term reliability, and one having indium tin oxide (ITO) as a main component is especially preferable. The transparent electrode layer may be a single layer or a layered structure composed of multiple layers. Each of the first transparent electrode layer 4 and the second transparent electrode layer 9 preferably has a thickness of 10 nm or more and 140 nm or less, from the viewpoints of transparency electroconductivity and reduction of light reflection.

In this specification, the wording "as a main component" means that the content is more than 50% by weight, preferably 70% by weight or more, more preferably 90% by weight or more.

(Plating Base Electrode Forming Step)

In one or more embodiments of the present invention, the plating base electrode 25 may be formed on the second transparent electrode layer 9 before formation of the plated metal electrode 21 as shown in FIG. 2G. The plating base electrode 25 may functions as an electroconductive underlying layer for formation of the plated metal electrode 21. When the plating base electrode 25 is formed on the surface of the second transparent electrode layer 9, the conductivity of the surface can be enhanced to improve efficiency of electroplating. As a metallic material that forms the plating base electrode 25, copper, nickel, tin, aluminum, chromium, silver, gold, zinc, lead, palladium or the like, or an alloy thereof can be used.

Although the method for forming the plating base electrode 25 is not particularly limited, a dry process such as a sputtering method or a vapor deposition method, or electroless plating is preferable for efficiently covering the entire surface of the second transparent electrode layer 9 by the plating base electrode 25. When a sputtering method is employed, the second transparent electrode layer 9 and the plating base electrode 25 can be also successively formed. Although the thickness of the plating base electrode 25 is not particularly limited, it is preferably 200 nm or less, more preferably 100 nm or less, further preferably 60 nm or less from the viewpoint of productivity. The thickness of the plating base electrode 25 is preferably 50% or less, more preferably 30% or less, further preferably 20% or less of the thickness of the plated metal electrode. On the other hand, for imparting high conductivity to the plating base electrode itself, the thickness of the plating base electrode 25 is preferably 10 nm or more, more preferably 20 nm or more, further preferably 30 nm or more.

The plating base electrode may be formed in a pattern shape, depending on the shape of the plating electrode layer. For efficiently forming a patterned base electrode, it is preferable to form the base electrode only in a necessary region using a liquid material such as an ink or a paste. Specifically, a known technique such as an inkjet method or a screen printing method can be used. From the viewpoint of productivity, a screen printing method is suitable for forming a patterned base electrode. In the screen printing method, a method is preferable in which pattern printing is performed using an electroconductive paste containing a particulate metallic material, and a screen plate having an opening section pattern corresponding to the pattern shape.

The thickness of the patterned plating base electrode is preferably 20 µm or less, more preferably 10 µm or less, in terms of costs. The thickness is preferably 0.5 µm or more, more preferably 1 µm or more, so that the line resistance of the plating base electrode falls within a desired range. The width of the patterned plating base electrode is preferably 100 µm or less, more preferably 70 µm or less, (First Insulating Layer Forming Step)

It is preferable to form the first insulating layer 10 on the first transparent electrode layer 4, as shown in FIG. 2F. As the material for the first insulating layer 10, silicon oxide, silicon nitride, titanium oxide, aluminum oxide, magnesium oxide, zinc oxide or the like may be used. These materials are not limited to those having a stoichiometric composition, but may be those having oxygen-deficiencies. From the viewpoint of suppressing diffusion of metal ions etc., it is preferable that the first insulating layer 10 has a dense structure, and it is more preferable that the first insulating layer 10 is amorphous.

The first insulating layer 10-formed region is not necessarily present on the first transparent electrode layer 4. Preferably, the first insulating layer 10 is formed on the entire first principal surface 51 of the n-type crystalline silicon substrate 1. By disposing the first insulating layer 10 on the insulating region 41 on the first principal surface as well, precipitation of a plating metallic material on the insulating region 41 can be suppressed. By forming the first insulating layer 10 on the wraparound portion 20 of the second transparent electrode layer 9 on the edge of the first principal surface as well, damage to the substrate and a short circuit can be prevented at the time when a wiring member 155 comes into contact with the surface of the peripheral portion of the solar cell 100, thereby improving the power generation of the solar cell module. More preferably, the first insulating layer 10 is formed not only on the entire first principal surface but also on a lateral surface and the peripheral portion of the second principal surface of the n-type crystalline silicon substrate 1. Accordingly the effect of protecting the n-type crystalline silicon substrate, the silicon-based thin-film and the transparent electrode layer from a plating solution, or from metal ions, water and the like that may be generated during long-term use can be improved.

The thickness of the first insulating layer 10 is appropriately set according to a material of the insulating layer and a formation method. When the first insulating layer 10 is removed before modularization of the solar cell, the thickness of the first insulating layer 10 is preferably small from the viewpoint of productivity. On the other hand, when the first insulating layer 10 is not removed, it is preferable that a transparent insulating layer with a low light absorption is used as the first insulating layer 10. In this case, improvement of the light reflection property increase of the amount of light introduced into the solar cell, and improvement of conversion efficiency may be attained by appropriately setting the optical properties and the thickness of the first insulating layer 10. For obtaining such an effect, the refractive index of the first insulating layer 10 is preferably lower than the refractive index of the surface of the first transparent electrode layer 4.

From the viewpoint of imparting suitable anti-reflection characteristics to the first insulating layer 10, it is preferable that the thickness is set within a range of 20 nm to 250 nm, more preferably within a range of 30 nm to 100 nm. The transmittance of the transparent insulating layer is preferably 80% or more, more preferably 90% or more. The first insulating layer 10 may include a plurality of layers. When the first insulating layer includes a plurality of layers, defects such as pinholes can be reduced, and the protection effect can be further improved.

Although the method for forming the first insulating layer 10 is not particularly limited, a plasma-enhanced CVD method, a sputtering method or a vapor deposition method is preferable for efficiently covering a surface on the n-type crystalline silicon substrate 1 having a texture. In particular, a plasma-enhanced CVD method is especially preferable because it is capable of stably preparing a first insulating layer amorphous, and excellent in adhesion strength to the transparent electrode layer, and has a suitable thickness as described above.

[Insulating Region]

FIGS. 4A to 4D are schematic sectional views each showing a deposition state in the vicinity of peripheral portion of the substrate before formation of the plated metal electrode in the process of manufacturing the crystalline silicon-based solar cell. In any of these forms, at least the first intrinsic silicon-based thin-film 2 is provided on the insulating regions 41 to 44 at the peripheral portion of the first principal surface of the n-type crystalline silicon substrate 1, and neither of the first transparent electrode layer 4 and the second transparent electrode layer 9 is provided on the insulation regions. Specifically, before formation of the plated metal electrode 21, the entire first principal surface, the entire second principal surface and the lateral surface of the n-type crystalline silicon substrate 1 are covered with the silicon-based thin-film, and the insulating region freed of a short-circuit between the first transparent electrode layer 4 and the second transparent electrode layer 9 is formed at the peripheral portion of the first principal surface of the n-type crystalline silicon substrate 1.

Even if the n-type silicon-based thin-film 8 is formed on the n-type crystalline silicon substrate 1, the n-type crystalline silicon substrate 1 and the n-type silicon-based thin-film 8 have the same conductivity-type (n-type), and therefore the effect of suppressing a plating current is lower as compared to a case where the p-type silicon-based thin-film 3 is formed on the n-type crystalline silicon substrate. Therefore, in one or more embodiments of the present invention, from the viewpoint of suppressing generation of a plated metal on the insulating region, the insulating region is provided on the first principal surface side where the p-type silicon-based thin-film is provided on the n-type crystalline silicon substrate 1 as shown in FIG. 2D.

When the insulating region is formed on the first principal surface 51-side of the n-type crystalline silicon substrate, a leakage current between the first transparent electrode layer 4 and the second transparent electrode layer 9, which passes through the n-type silicon-based thin-film 8 and the n-type crystalline silicon substrate 1, can be suppressed, and therefore a solar cell module having higher conversion efficiency can be obtained as compared to a case where the insulating layer is present on the second principal surface side of the n-type crystalline silicon substrate.

Figure 4A:
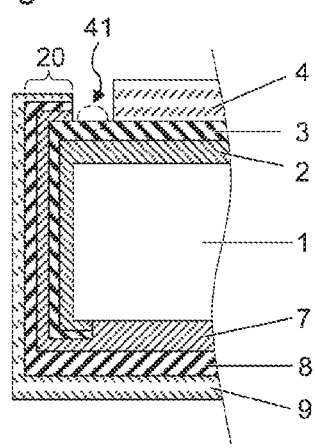
FIGS. 4A to 4D are schematic sectional views each showing a deposition state in the vicinity of the peripheral portion of a substrate in a process for manufacturing a crystalline silicon-based solar cell module (before formation of a plated metal electrode).

In FIG. 4A, the first intrinsic silicon-based thin-film 2 and the p-type silicon-based thin-film 3 are formed on the entire first principal surface side and a lateral surface of the n-type crystalline silicon substrate 1, and the second intrinsic silicon-based thin-film 7, the n-type silicon-based thin-film 8 and the second transparent electrode layer 9 are formed on the entire second principal surface side and a lateral surface of the n-type crystalline silicon substrate 1. The first transparent electrode layer 4 is formed in the entire region on the first principal surface side except for the peripheral portion, and is not formed on a lateral surface and the second principal surface. When the first transparent electrode layer 4 is deposited with a mask disposed on the peripheral portion of the first principal surface of the n-type crystalline silicon substrate 1 as shown in FIG. 2D, the first transparent electrode layer 4 is not formed on the peripheral portion of the first principal surface, and wraparound of the first transparent electrode layer 4 to a lateral surface and the second principal surface does not occur. When deposition is performed without using a mask during formation of the silicon-based thin-films 2, 3, 7 and 8 and the second transparent electrode layer 9, the peripheral portion of the first principal surface of the n-type crystalline silicon substrate 1 includes the insulating region 41 on which neither the first transparent electrode layer 4 nor the second transparent electrode layer 9 is deposited, as shown in FIG. 4A.

Figure 4B:
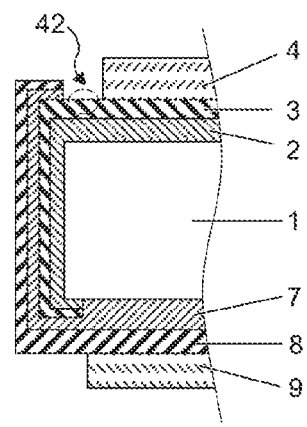
Figure 4C:
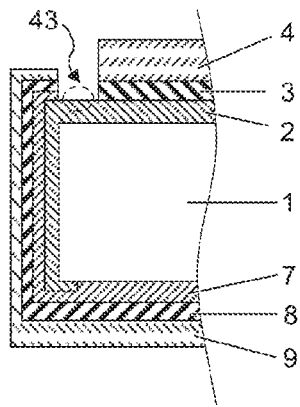
Figure 4D:
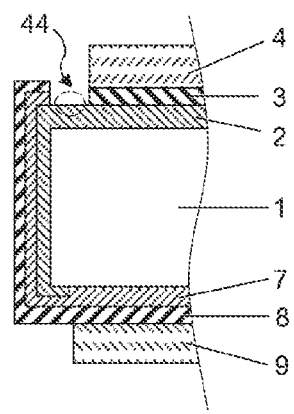

When a mask is used during formation of the second transparent electrode layer 9, and deposition is performed with a mask disposed on the peripheral portion of the second principal surface of the n-type crystalline silicon substrate 1, the insulating region 42 is formed on the peripheral portion of the first principal surface of the n-type crystalline silicon substrate 1 as shown in FIG. 4B. In this case, loss in collection of a current generated in the insulating region 41 increases as compared to a case where a mask is not used during formation of the second transparent electrode layer 9, leading to deterioration of conversion efficiency Insulating regions 43 and 44, in which the intrinsic silicon-based thin-film 2 is present, and the transparent electrode layer and the conductive silicon-based thin-film are absent, can be formed on the peripheral portion of the first principal surface of the n-type crystalline silicon substrate 1 as shown in FIGS. 4C and 4D, by disposing a mask on the peripheral portion of the first principal surface of the n-type crystalline silicon substrate 1 during formation of the p-type silicon-based thin-film. However, process control may be complicated in these modes, since alignment of a mask in formation of the p-type silicon-based thin-film and alignment of another mask in formation of the first transparent electrode layer 4 are required for preventing a leakage current that may be caused by a contact between the n-type crystalline silicon substrate 1 and the first transparent electrode layer 4. In addition, if damage occurs due to contact between the mask and the n-type crystalline silicon substrate 1, conversion efficiency may be deteriorated.

Therefore, from the viewpoint of improving the conversion efficiency of the solar cell, it is especially preferable that, as shown in FIG. 4A, the first intrinsic silicon-based thin-film 2 and the p-type silicon-based thin-film 3 are formed on the entire first principal surface 51-side and a lateral surface of the n-type crystalline silicon substrate, and the second intrinsic silicon-based thin-film 7, the n-type silicon-based thin-film 8 and the second transparent electrode layer 9 are formed on the entire second principal surface 52-side and a lateral surface of the n-type crystalline silicon substrate. Further, since the intrinsic silicon-based thin-film 2 and the p-type silicon-based thin-film 3 are formed on the insulating region 41, precipitation of an undesirable metal due to leakage is suppressed.

When a mask is not used during deposition of the p-type silicon-based thin-film 3, and thus the p-type silicon-based thin-film 3 is formed on the lateral surface 55 as well as on the entire first principal surface 51 of the n-type crystalline silicon substrate 1 as shown in FIG. 4A, the first intrinsic silicon-based thin-film 2 and the p-type silicon-based thin-film 3 can be successively deposition, and therefore production efficiency can be further improved.

When the peripheral portion of the first principal surface of the n-type crystalline silicon substrate 1 includes an insulating region, on which the silicon-based thin-film is present and neither of the first transparent electrode layer 4 and the second transparent electrode layer 9 is present, precipitation of an undesired metal during deposition of the plated metal electrode 21 can be suppressed. Particularly, when deposition of the first intrinsic silicon-based thin-film 2 is performed before deposition of the second intrinsic silicon-based thin-film 7, the effect of suppressing precipitation of a plated metal due to leakage is high.

When a mask is not used during deposition of the second transparent electrode layer 9, and thus the second transparent electrode layer 9 is also formed on the entire second principal surface 52-side and the lateral surface of the n-type crystalline silicon substrate as shown in FIG. 4A, the silicon-based thin-film is protected from a plating solution by a conductive oxide that forms the transparent electrode layer. Thus, deterioration of characteristics due to alloying of silicon, diffusion of a metal component in the plating solution into the n-type crystalline silicon substrate 1, and so on can be suppressed.

When the silicon-based thin-film and the second transparent electrode layer 9 are formed on the lateral surface 55 of the n-type crystalline silicon substrate, as shown in FIG. 4A, ingress of moisture etc. from the lateral surface is suppressed in practical use of the solar cell. Since it is not required to use a mask during deposition of the second transparent electrode layer 9, steps for arrangement and alignment of the mask are unnecessary, so that production efficiency of the solar cell can be improved. Further, the second transparent electrode layer 9 is also formed on the peripheral portion of the second principal surface 52 of the n-type crystalline silicon substrate, and therefore carrier collection efficiency on the second principal surface of the n-type crystalline silicon substrate 1 is improved.

When the second transparent electrode layer is formed without using a mask, wraparound of the second transparent electrode layer 9 onto the peripheral portion of the first principal surface of the n-type crystalline silicon substrate 1 generally occurs, so that the wraparound portion 20 is formed as shown in FIG. 2E and FIG. 4A. With the wraparound portion 20 of the second transparent electrode layer 9, the silicon-based thin-film on the peripheral end of the first principal surface 51 of the n-type crystalline silicon substrate and in the vicinity thereof can be covered and protected.

From the viewpoint of protecting the silicon-based thin-film on the peripheral end of the first principal surface 51 of the n-type crystalline silicon substrate and in the vicinity thereof, the width $W_2$ of the wraparound portion 20 of the second transparent electrode layer 9 is preferably 5 μm or more, more preferably 10 µm or more. On the other hand, for improving carrier collection efficiency by the first transparent electrode layer 4, the size of a first transparent electrode layer-formed region on the first principal surface side of the n-type crystalline silicon substrate 1 is preferably large, and from the viewpoint of preventing a short circuit between the wraparound portion 20 of the second transparent electrode layer 9 and the first transparent electrode layer 4 on the first principal surface 51 of the n-type crystalline silicon substrate, the width W2 of the wraparound portion 20 of the second transparent electrode layer 9 is preferably small as long as the peripheral end of the first principal surface of the n-type crystalline silicon substrate 1 can be reliably protected. The width $W_2$ is preferably 3 mm or less, more preferably 2 mm or less, further preferably 1 mm or less. The width W2 of the wraparound portion and the width $W_1$ of the insulating region are determined by observing the surface of the solar cell with an optical microscope.

(Plated Metal Electrode Forming Step)

After the formation of the silicon-based thin-films 2, 3, 7 and 8 and the transparent electrode layers 4 and 9 on the n-type crystalline silicon substrate 1, the plated metal electrode 21 is formed on the second transparent electrode layer 9 by an electroplating method. Material of the plated metal electrode 21 is not particularly limited as long as it is a material that can be deposited by a plating method. For example, copper, nickel, tin, aluminum, chromium, silver, gold, zinc, lead, palladium, and alloys thereof may be precipitated as the plated metal electrode 21. Among them, copper or an alloy including copper as a main component is preferable for the metal that forms the plated metal electrode due to high precipitation rate in electroplating, high electroconductivity and low material cost.

Formation of the plated metal electrode 21 is performed by immersing an anode in a plating solution, and applying a voltage between the anode and the second transparent electrode layer with the second transparent electrode layer 9 (or the plating base electrode 25 formed on the surface thereof) brought into contact with the plating solution. A plated metal electrode including copper as a main component can be formed by, for example, an acidic copper plating. A plating solution used for acidic copper plating contains copper ions, and a solution of known composition, which includes copper sulfate, sulfuric acid and water as main components, can be used. Copper can be precipitated on the second transparent electrode layer 9 by causing a current of 0.1 to 20 A/dm$^2$ to pass the plating solution. The suitable plating time is appropriately set according to the area of the electrode, the current density, cathode current efficiency, desired thickness and so on.

The plated metal electrode 21 may be a stack of a plurality of layers. For example, by forming a first plated layer made of a material having a high electroconductivity, such as copper, and then forming a metal layer that has higher chemical stability than the first plated metal layer, a back metal electrode having low resistance and being excellent in chemical stability can be formed.

Although the plated metal electrode 21 is disposed on the entire surface of the second transparent electrode layer 9 in FIG. 1, the plated metal electrode layer disposed on the second transparent electrode layer may have a pattern shape. When a patterned plated metal electrode is formed, it is preferable that a plating base electrode is formed in a pattern shape, and the insulating layer is formed on the second transparent electrode layer 9 excluding the plating base electrode-formed region, in view of suppressing undesirable plating precipitation and diffusion of impurities.

A patterned plated metal electrode may also be formed by a method in which the metallic material is formed as a plating base electrode on the entire surface of the second transparent electrode layer 9, a resist layer having a predetermined pattern opening is formed on the plating base electrode, and a plated metal electrode is formed so as to fill the opening. In this mode, the plated metal electrode may be formed, followed by removing the resist layer, and removing the plating base electrode 25 exposed on a region where the patterned plated metal electrode is not provided. The opening pattern of the resist layer can be formed by photolithography or a pattern printing method. By forming the plated metal electrode into a pattern shape, light incident from the back side of the crystalline silicon solar cell can be captured to improve the power generation of the solar cell module.

(Patterned Collecting Electrode Formation Step)

The patterned collecting electrode 11 is formed on the first transparent electrode layer 4. The method for forming the patterned collecting electrode 11 is not particularly limited, and the patterned collecting electrode can be formed by a plating method, a printing method such as inkjet printing or screen printing, a conductor bonding method or the like. For example, in the screen printing method, a process in which a conductive paste composed of metal particles and a resin binder is applied by screen printing is preferably used.

In the plating method, a patterned plating collecting electrode can be formed by plating under a state in which the first insulating layer 10 having an opening corresponding to the pattern shape of the collecting electrode is disposed on the first transparent electrode layer 4. By providing the first insulating layer 10 on the first transparent electrode layer 4, precipitation of an undesirable plating metallic material on a region other than the patterned plating collecting electrode-formed region on the first transparent electrode layer 4 can be suppressed during formation of the patterned plating collecting electrode by a plating method. Therefore, high conversion efficiency and reliability can be attained by forming the first insulating layer 10.

When a patterned plating collecting electrode is formed, it is preferable that a patterned seed electrode (not illustrated) is formed on the first transparent electrode layer 4 (pattern seed forming step), and the first insulating layer 10 is formed so as to cover the first transparent electrode layer 4. The first insulating layer is formed so as to have an opening on at least a part of the seed electrode, and the plating collecting electrode is formed through the opening of the first insulating layer by electroplating. For example, as disclosed in Patent Document 3 (WO 2013/161127) etc., the patterned collecting electrode 11 may be formed by depositing a metal on the seed electrode of the patterned collecting electrode, with an opening of the first insulating layer on the seed electrode as an origination point for plating. When the patterned collecting electrode 11 is formed by electroplating, it is preferable that electroplating is performed in a state in which the first transparent electrode layer 4 and the second transparent electrode layer 9 are not short-circuited (an insulating region is formed as described above) for suppressing precipitation of an undesired metal on the lateral surface and the second principal surface of the n-type crystalline silicon substrate.

Formation of the patterned collecting electrode 11 on the first principal surface of the n-type crystalline silicon substrate 1 may be performed before or after formation of the plated metal electrode 21 on the second principal surface of the n-type crystalline silicon substrate 1. When the patterned plating collecting electrode 11 is formed by electroplating, formation of the patterned collecting electrode 11 can be performed simultaneously with formation of the plated metal electrode 21. For example, by supplying electricity to each of the first principal surface and the second principal surface of the n-type crystalline silicon substrate 1 in a state in which the first transparent electrode layer 4 and the second transparent electrode layer 9 are not short-circuited, the plated metal electrode 21 and the patterned collecting electrode 11 can be simultaneously formed. According to this method, the number of steps of forming an electrode layer by plating can be reduced, so that productivity can be improved.

(Wiring Member Mounting Step)

The crystalline silicon-based solar cell manufactured in the manner described above is modularized for practical use. FIG. 8 is a schematic sectional view showing a solar cell module of one embodiment. Generally, in the solar cell module, a plurality of solar cells 100 are electrically connected via a wiring member 155 as shown in FIG. 8. In preparation of a solar cell module in which a plurality of solar cells are connected, a solar cell string in which a plurality of solar cells 100 are mutually connected via the wiring member 155 is prepared.

When a plurality of solar cells are connected in series, the patterned collecting electrode 11 disposed on an light receiving-surface of one solar cell and the plated metal electrode 21 disposed on a back surface of the adjacent solar cell are connected via the wiring member 155. The wiring members 150 for making electrical connection to an external circuit are mounted to solar cells 100 at both ends, which form the solar cell string. The electrode of the solar cell and the wiring member are connected via, for example, an appropriate adhesive (not illustrated).

The wiring member is a plate-shaped electroconductive member for connecting solar cells or connecting an external circuit to a solar cell, and has bending property. As a material of the wiring member, copper is generally used. The surface of a core material such as copper may be covered with a covering material. As the covering material for the wiring member, solder is widely used for facilitating bonding the wiring member to the electrode in the solar cell. As the covering member, a metal such as silver, tin or nickel may be used. When silver is used as the covering material, the reflectivity of the wiring member can be increased. When nickel is used as the covering material, the reflectivity of the wiring member can be reduced to improve the design property of the solar cell module. A plate-shape member having, on an upper surface (light incident surface) 155a, morphology structure having a height of about 5 μm to 100 μm may be used as the wiring member. When the wiring member has a morphology structure on the upper surface, reflected light at the surface of the wiring member is diffused, so that the reflected light can be made to efficiently reenter the solar cell, and therefore module performance can be improved.

When the silicon-based thin-film or silicon substrate of the photoelectric conversion section is exposed in the vicinity of the peripheral end of the n-type crystalline silicon substrate, mechanical damage easily occurs due to contact with the wiring member. In the heterojunction solar cell, occurrence of mechanical damage to the silicon-based thin-film may impair the passivation function of the silicon substrate surface, leading to considerable deterioration of conversion characteristics.

Figure 9:
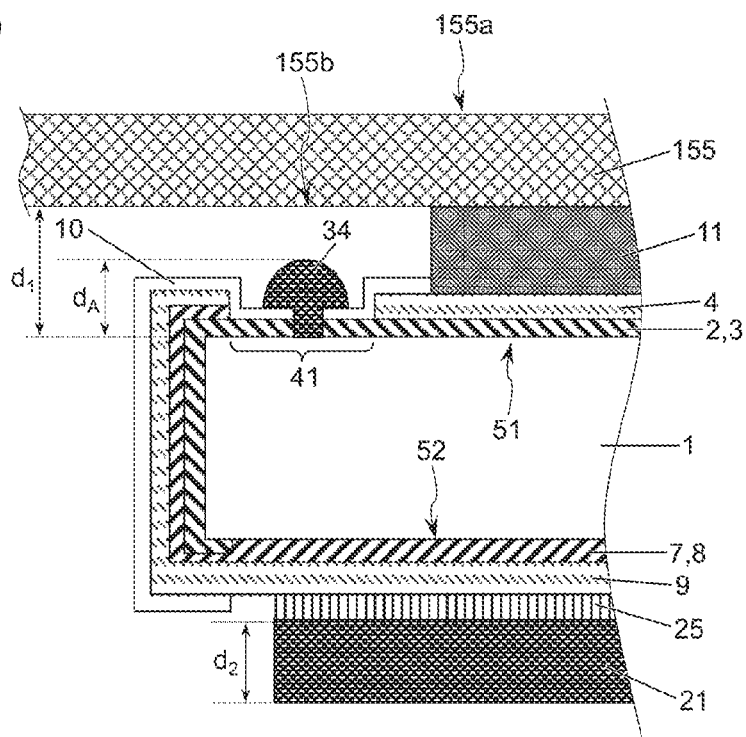
FIG. 9 is a schematic sectional view showing a configuration in the vicinity the peripheral portion of a silicon substrate in a crystalline silicon-based solar cell module.

On the other hand, in one or more embodiments of the present invention, the surface of the silicon-based thin-film is protected by the wraparound portion 20 of the second transparent electrode layer 9 at the peripheral end of the first principal surface as shown in FIG. 9, and therefore mechanical damage to the silicon-based thin-film due to contact with the wiring member 155 can be prevented. Further, by decreasing the thickness of the wraparound portion 20 of the second transparent electrode layer 9, resistance is increased, so that a leakage current is hardly generated. Further, when the first insulating layer 10 is formed so as to cover the peripheral portion of the n-type crystalline silicon substrate 1, a leakage current is not generated even if the wiring member 155 comes into contact with the first insulating layer 10 on the wraparound portion 20 of the second transparent electrode layer 9. Thus, a crystalline silicon-based solar cell module having high efficiency can be provided.

The patterned collecting electrode 11 on the first principal surface 51-side of the n-type crystalline silicon substrate is connected to a lower surface 155b of the wiring member 155, whereas the electrode on the second principal surface side of the n-type crystalline silicon substrate 1 is connected to an upper surface 155a of the wiring member. When a wiring member having a morphology structure on the upper surface 155a is used, the second principal surface 52-side of the n-type crystalline silicon substrate 1 is susceptible to mechanical damage due to contact with projections of the morphology structure of the wiring member. When the insulating region 41 is present on the second principal surface side of the n-type crystalline silicon substrate 1, mechanical damage to the silicon-based thin-film easily occurs due to contact between the projection of the morphology structure of the wiring member 155 and the insulating region, and thus module conversion characteristics are deteriorated.

In the method for manufacturing a solar cell module according to one or more embodiments of the present invention, the second transparent electrode layer is formed on the entire second principal surface of the n-type crystalline silicon substrate 1, and therefore even when a wiring member having an morphology structure on the upper surface 155a is used, mechanical damage to the silicon-based thin-film on the second principal surface side of the n-type crystalline silicon substrate 1 hardly occurs. Thus, reflected and scattered light at the surface of the wiring member can be efficiently reused, and mechanical damage due to mount of the wiring member 155 is small, so that a solar cell module having high conversion characteristics can be obtained.

The solar cell 100 is sandwiched between protective materials 131 and 132 with an encapsulant 120 interposed between the solar cell 100 and the protective materials 131 and 132, so that a solar cell module is formed. For example, the protective materials 131 and 132 are arranged on the light-receiving side and the back side, respectively of the solar cell 100 with the encapsulant interposed therebetween, so that a laminated body is obtained, and thereafter the laminated body is heated under a predetermined condition, whereby the encapsulant 120 is cured to perform encapsulation. Then, an Al frame (not illustrated) etc. is attached to prepare the solar cell module.

As the protective material 131 on the light-receiving side, a material having translucency and water impermeability such as a glass, a transparent plastic, or the like can be used. As the protective material 132 on the back side, a resin film such as PET film, a laminated film having a structure with an Al foil sandwiched by resin films, or the like can be used. The encapsulant 120 seals the solar cell 100 between the protective materials 131 and 132 on the light receiving surface and the back surface. As the encapsulant, a transparent resin such as EVA, EEA, PVB, silicone, urethane, acryl, epoxy, or the like can be used.

The solar cell is sealed in the above-described manner to suppress ingress of external moisture etc. into the solar cell, so that the long-term reliability of the solar cell module can be improved. The protective materials 131 and 132 are adhesively stacked on the light-receiving side and the back side, respectively, of the solar cell 100 with the encapsulant 120 interposed therebetween, whereas the lateral surface of the solar cell is only protected by the encapsulant. Thus, in the solar cell module, external moisture etc. tends to easily come into contact with the solar cell from the lateral surface. In the solar cell according to one or more embodiments of the present invention, the silicon-based thin-film is also formed on the lateral surface of the n-type crystalline silicon substrate 1, and therefore ingress of moisture etc. into the crystalline silicon substrate from the lateral surface of the solar cell is suppressed. Particularly, when the plated metal electrode 21 is also formed on the lateral surface of the solar cell as shown in FIG. 8, ingress of moisture etc. from the lateral surface can be further suppressed, so that the long-term reliability of the solar cell module can be further improved.

[Precipitation of Metal by Electroplating]

As described above, plating metal may be precipitated in the insulating region 41 in the plated metal electrode forming step. Hereinafter, precipitation of a plating metal due to leakage in formation of the plated metal electrode 21 on the second principal surface of the n-type crystalline silicon substrate 1 by electroplating will be described with reference to FIGS. 5A to 5E associated with a comparative example.

Figure 5A:
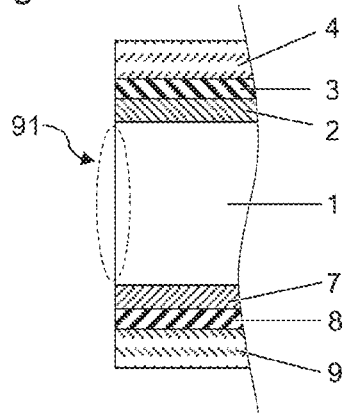
FIGS. 5A to 5E are schematic sectional views each showing a deposition state in the vicinity of the peripheral portion of a substrate in a process for manufacturing a crystalline silicon-based solar cell module (before formation of a plated metal electrode) in a comparative example.
Figure 5B:
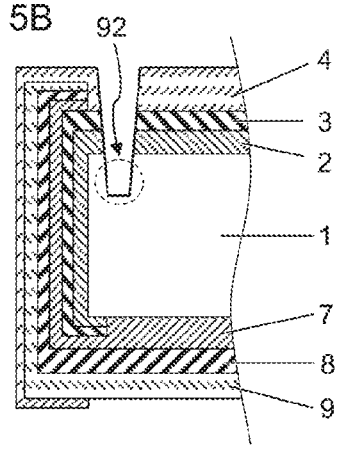

Examples of the method for removing leakage between the first transparent electrode layer 4 and the second transparent electrode layer 9 include a method in which the peripheral portion of the substrate is cleaved and removed by laser irradiation. In this mode, as shown in FIG. 5A, the lateral surface of the n-type crystalline silicon substrate 1 is exposed in the insulating region 91. In addition, when the transparent electrode layer 4 is removed by laser irradiation, and the insulating region is formed, it is difficult to remove only the transparent electrode layer 4. Thus, as shown in FIG. 5B, the groove reaches the silicon substrate 1, and the n-type crystalline silicon substrate 1 is exposed in the insulating region 92.

When electroplating is performed by feeding electricity through the second transparent electrode layer 9 in a state in which the n-type crystalline silicon substrate 1 is exposed as described above, electrons are also supplied (a plating current passes) to the n-type crystalline silicon substrate 1 through the n-type silicon-based thin-film 8 from the second transparent electrode layer 9, and therefore a plating metal is precipitated from the insulating regions 91 and 92 that are exposed portions of the n-type crystalline silicon substrate 1. Precipitation of such an undesirable metal generates a new short circuit and leakage path, resulting in reduction of the fill factor and the open circuit voltage of the solar cell. In addition, precipitation of a metal on the first principal surface of the n-type crystalline silicon substrate 1 causes shading by the metal, so that the amount of light captured in the n-type crystalline silicon substrate 1 from the light-receiving surface side (first principal surface side of the n-type crystalline silicon substrate 1) is reduced, resulting in reduction of the current density of the solar cell.

Figure 5C:
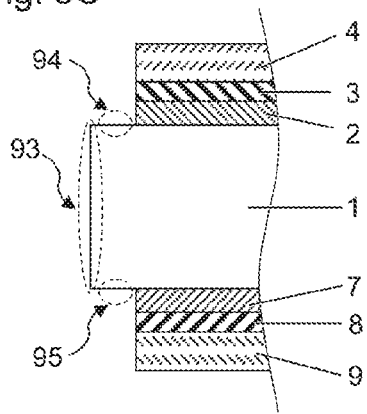
Figure 5D:
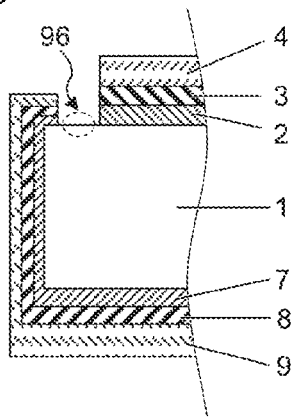

When the silicon-based thin-films 2 and 3 and the transparent electrode layer 4 are deposited with a mask disposed on the peripheral portion of the first principal surface 51 of the n-type crystalline silicon substrate, and the silicon-based thin-films 7 and 8 and the transparent electrode layer 9 are deposited with a mask disposed on the peripheral portion of the second principal surface 52 of the n-type crystalline silicon substrate, insulating regions 93, 94 and 95, in which the n-type crystalline silicon substrate 1 is exposed, are formed on the lateral surface 55 of the n-type crystalline silicon substrate, on the peripheral portion of the first principal surface 51 and on the peripheral portion of the second principal surface 52 of the n-type crystalline silicon substrate as shown in FIG. 5C. When the silicon-based thin-films 2 and 3 and the transparent electrode layer 4 are deposited with a mask disposed on the peripheral portion on the first principal surface 51-side of the n-type crystalline silicon substrate, and a mask is not used for deposition of the silicon-based thin-films 7 and 8 and the transparent electrode layer 9 on the second principal surface 52-side of the n-type crystalline silicon substrate, the insulating region 96, in which the n-type crystalline silicon substrate is exposed, is formed on the peripheral portion of the first principal surface of the n-type crystalline silicon substrate as shown in FIG. 5D. Even in these modes, a metal is precipitated in the insulating region, or metal ions in the plating solution are diffused into the silicon substrate when electroplating is performed by feeding electricity through the second transparent electrode layer 9.

Figure 5E:
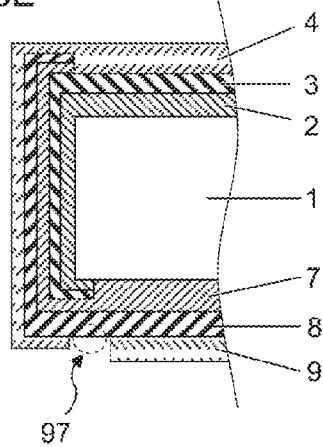

When a mask is not used during deposition of the silicon-based thin-films 2 and 3 and during deposition of the first transparent electrode layer 4 on the first principal surface 51-side of the n-type crystalline silicon substrate, and during deposition of the silicon-based thin-films 7 and 8 on the second principal surface 52-side of the n-type crystalline silicon substrate, and the second transparent electrode layer 9 is deposited with a mask disposed on the peripheral portion of the second principal surface 52 of the n-type crystalline silicon substrate, the peripheral portion of the second principal surface 52 of the n-type crystalline silicon substrate includes the insulating region 97 in which the second intrinsic silicon-based thin-film 7 and the n-type silicon-based thin-film 8 are deposited and the second transparent electrode layer 9 is not deposited, as shown in FIG. 5E.

When electroplating is performed by feeding electricity through the second transparent electrode layer 9 in a state in which the insulating region is present only on the second principal surface 52-side of the n-type crystalline silicon substrate, and the insulating region is not present on the first principal surface 51-side of the n-type crystalline silicon substrate, electrons are also supplied to the insulating region 97 and the first transparent electrode layer 4 through the n-type silicon-based thin-film 8 from the second transparent electrode layer 9, so that a plating metal is precipitated. In addition, when precipitation of a plating metal on the insulating region 97 progresses, the second transparent electrode layer 9 and the first transparent electrode layer 4 are brought into continuity with each other through the precipitated metal, leading to occurrence of a short circuit between the transparent electrode layers on the front and the back.

In the insulating region 41, the silicon-based thin-films 2 and 3 are formed on the peripheral portion of the first principal surface 51 of the n-type crystalline silicon substrate, and the p-n junction between the n-type crystalline silicon substrate 1 and the p-type silicon-based thin-film 3 forms an electric field barrier as shown in FIG. 4A Thus, even when electroplating is performed by feeding electricity through the second transparent electrode layer 9, precipitation of a metal on the insulating region due to leakage hardly occurs as long as the surface of the n-type crystalline silicon substrate 1 has no exposed region.

Note that the plating metallic material may be precipitated in the plating electrode forming step when the silicon-based thin-film has pinholes or the like and thus formation of a barrier is locally insufficient. Accordingly it is difficult to completely inhibit precipitation of the plating metallic material in practice so that the plated metal region 34 may be formed on the insulating region 41 as shown in FIG. 2H, even when the insulating region 41 is provided on the peripheral portion of the first principal surface as shown in FIG. 4A.

[Shape of Plated Metal Region]

In the electroplating method, a metal is isotropically precipitated in general, and therefore the plated metal region formed on the insulating region has a substantially circular shape in plan view, which is centered on the origination point of plating deposition as shown in FIG. 7A As can be understood from the cross-sectional shape schematically shown in FIG. 7B, the width of the plated metal region 34 is twice as large as the thickness $d_A$, i.e., $2 \times d_A$. The width of the plated metal region can be determined by, for example, observation with a microscope. The width of the plated metal region can be determined from the diameter when the plated metal region has a circular shape. When the plated metal region has a non-circular shape, the maximum transverse line length in the width direction of the insulating region 41 is defined as a width of the plated metal region.

When the density of the origination point of plating precipitation is low, the plated metal region 34 is present as an isolated island-like region on the insulating region 41. The island-like plated metal region 34 does not contribute to electrical conduction in the thickness direction of the n-type crystalline silicon substrate 1 and a direction perpendicular to the thickness direction (also referred to as a horizontal direction).

On the other hand, when the density of the origination point of plating precipitation increases, adjacent plated metal regions come into contact with each other to form an integrated shape as shown in FIG. 7C, and therefore electrical conduction in the horizontal direction occurs. When the plated metal region 234 is shaped to traverse the insulating region 41, the first transparent electrode layer 4 and the second transparent electrode layer 9 are short-circuited, leading to deterioration of solar cell characteristics.

Therefore, when the plated metal region 34 is formed in the insulating region 41, the plated metal region 34 is preferably in the form of island. For preventing the plated metal region 34 from traversing the insulating region 41 to cause a short circuit between the first transparent electrode layer 4 and the second transparent electrode layer 9, the width $W_1$ of the insulating region 41 is preferably larger than the width of the plated metal region 34. That is, it is preferable to satisfy the relationship of $2d_A < W_1$. From the viewpoint of more reliably preventing occurrence of a short circuit between the first transparent electrode layer 4 and the second transparent electrode layer 9, it is more preferable to satisfy the relationship of $3d_A < W_1$, and it is further preferable to satisfy the relationship of $4d_A < W_1$.

FIG. 9 is a schematic sectional view of the vicinity of the peripheral end of the first principal surface 51 of the n-type crystalline silicon substrate in the solar cell module after encapsulation. In the wiring member mounting step, the wiring member 155 is mounted onto the patterned collecting electrode 11, and disposed over the insulating region 41 as well. When the plated metal region 34 is formed on the insulating region 41, the plated metal region 34 is electrically connected to the second transparent electrode layer 9. The wiring member 155 is electrically connected to the patterned collecting electrode 11 and the first transparent electrode layer 4, and therefore when the plated metal region 34 and the wiring member 155 come into contact with each other, a short circuit between the first transparent electrode layer 4 and the second transparent electrode layer 9 occurs. The thickness $d_A$ of the plated metal region 34 should be made smaller than the thickness $d_1$ of the patterned collecting electrode to separate the wiring member 155 from the plated metal region 34, even when the plated metal region 34 is formed in the plated metal electrode forming step, for suppressing a short circuit as described above. In other words, the plated metal region 34 may be formed so as to satisfy the relationship of $d_A < d_1$. From the viewpoint of more reliably preventing a short circuit, it is more preferable to satisfy the relationship of $d_A < 0.8 \times d_1$, and it is further preferable to satisfy the relationship of $d_A < 0.6 \times d_1$.

In the plated metal electrode forming step, the electrical potential of the exposed region of the n-type crystalline silicon substrate 1 is almost equal to that of the second transparent electrode layer, and therefore the thickness $d_A$ of the plated metal region 34 is approximately equal to the thickness $d_2$ of the plated metal electrode 21. Therefore, for satisfying the relationship $d_A < d_1$, the thickness $d_1$ of the patterned collecting electrode 11 may be made larger than the thickness $d_2$ of the plated metal electrode. The thickness $d_A$ of the plated metal region is approximately equal to the thickness $d_2$ of the plated metal electrode 21. Therefore, for more reliably preventing a short circuit, it is more preferable to satisfy the relationship of $d_2 < 0.8 \times d_1$, and it is further preferable to satisfy the relationship of $d_2 < 0.6 \times d_1$.

The thickness $d_1$ of the patterned collecting electrode 11, the thickness $d_2$ of the plated metal electrode 21 and the thickness $d_A$ of the plated metal region are determined by observing a cross-section with a scanning electron microscope. The thickness $d_1$ of the patterned collecting electrode 11, the thickness $d_2$ of the plated metal electrode 21 and the thickness $d_A$ of the plated metal region are determined at a point where the height from a surface of the n-type crystalline silicon substrate is maximum. When the thickness of each of the silicon-based thin-films 2 and 3 is sufficiently smaller than the thickness of the plated metal region 34 in determination of the thickness of the plated metal region, the thickness of the silicon-based thin-film may be ignored. When an n-type crystalline silicon substrate having a texture is used, the basis of the surface of the n-type crystalline silicon substrate is set to a valley portion of the texture.

[Order of Deposition of Silicon-Based Thin-Films]

As described above, the plated metal region formed in the insulating region may cause a shading loss and a short circuit, and therefore in manufacturing of a crystalline silicon-based solar cell module having high efficiency, suppression of generation of the plated metal region is an important factor. As described above, in one or more embodiments of the present invention, generation of the plated metal region in the insulating region in the plated metal electrode forming step can be reduced by depositing the first intrinsic silicon-based thin-film 2 before depositing the second intrinsic silicon-based thin-film 7.

When the silicon-based thin-film is formed in the insulating region 41 as shown in FIG. 4A, precipitation of a metal on the insulating region due to leakage hardly occurs. On the other hand, when the exposed region 33 of the n-type crystalline silicon substrate 1 is present in the insulating region 41 as shown in FIG. 6B, the exposed region 33 of the n-type crystalline silicon substrate 1 comes into contact with a plating solution in the plated metal electrode forming step. When a plating current passes as indicated by an arrow in FIG. 6B under the above state, the plating metallic material is precipitated on the exposed region 33 of the n-type crystalline silicon substrate 1, so that the plated metal region 34 is formed. When the density of the exposed region serving as the origination point of plating precipitation increases, adjacent plated metal regions may come into contact with each other to form a plated metal region 234 having a large area as shown in FIG. 7C, leading to occurrence of a short circuit between the first transparent electrode layer 4 and the second transparent electrode layer 9.

For suppressing generation of the plated metal region, it is necessary to reduce contaminants sticking to the first principal surface 51 of the n-type crystalline silicon substrate, which causes formation of an exposed region of the n-type crystalline silicon substrate 1. This is because deposition in the vicinity of contaminants is shielded by contaminants sticking onto the first principal surface 51 of the n-type crystalline silicon substrate, leading to generation of a region where the silicon-based thin-film is absent.

Generally, a silicon-based thin-film is deposited with an n-type crystalline silicon substrate placed on a tray. During deposition of the silicon-based thin-film on the second principal surface 52 of the n-type crystalline silicon substrate, the first principal surface 51 of the n-type crystalline silicon substrate comes into contact with a tray and therefore contaminants stuck on the tray are deposited on (transferred to) the first principal surface 51 of the n-type crystalline silicon substrate.

The size of the contaminants 31 may be several μm to several tens μm. When the intrinsic silicon-based thin-film 2, the p-type silicon-based thin-film 3 and the first insulating layer 10 are deposited on the first principal surface 51 of the n-type crystalline silicon substrate, on which contaminants on the tray are deposited by transfer, it is difficult to deposit the thin-films so as to completely cover contaminants 31 because the thickness of each of these thin-films is much smaller than the size of the contaminants. In addition, deposition of each layer is interrupted by the contaminants 31. Thus, the exposed region 33 of the n-type crystalline silicon substrate, where any of the first intrinsic silicon-based thin-film 2, the p-type silicon-based thin-film 3 and the first insulating layer 10 is not formed on the first principal surface 51 of the n-type crystalline silicon substrate, is formed in the vicinity of contaminants 31 (FIG. 6B).

When the first intrinsic silicon-based thin-film 2 is deposited before deposition of the second intrinsic silicon-based thin-film 7, the first principal surface 51 of the n-type crystalline silicon substrate does not come into contact with the tray before deposition of the first intrinsic silicon-based thin-film 2. Thus, in deposition of the first intrinsic silicon-based thin-film 2 on the first principal surface 51 of the n-type crystalline silicon substrate, the first principal surface 51 of the n-type crystalline silicon substrate can be completely covered with the first intrinsic silicon-based thin-film 2 and the p-type silicon-based thin-film 3 without being affected by contaminants on the tray. Precipitation of the plated metal region 34 in the vicinity of contaminants 31 can also be suppressed even if contaminants 31 etc. stick to the surface of the p-type silicon-based thin-film 3 after the p-type silicon-based thin-film 3 is formed. This is because the first intrinsic silicon-based thin-film 2 and the p-type silicon-based thin-film 3 are located closer to the n-type crystalline silicon substrate 1 than the contaminants 31 as shown in FIG. 6A and thus the first intrinsic silicon-based thin-film 2 and the p-type silicon-based thin-film 3 function as current barrier.

In one or more embodiments of the present invention, formation of the first intrinsic silicon-based thin-film 2 on the entire region on the first principal surface 51 and a lateral surface of the n-type crystalline silicon substrate 1 is carried out first. From the viewpoint of suppressing supply of a plating current to the exposed region of the n-type crystalline silicon substrate 1, it is preferable to form the p-type silicon-based thin-film successively to the first intrinsic silicon-based thin-film. This is because successive formation of the thin-films reduces the possibility that contaminants stick to the films.

In addition to sticking of contaminants in a deposition apparatus, contaminants may stick to the tray in detachment of a wafer, but the possibility that contaminants 31 on the tray stick to the insulating region 41 during deposition of the silicon-based thin-film is lower than the possibility that contaminants 31 stick to the first principal surface 51 of the n-type crystalline silicon substrate. Therefore, when the formation of first intrinsic silicon-based thin-film 2 is carried out before deposition of the second intrinsic silicon-based thin-film 7, the possibility that the plated metal region 34 is generated in proximity in the insulating region can be reduced and thus the island-like plated metal region 34 as shown in FIGS. 7A and 7B may be formed.

Figure 10A:
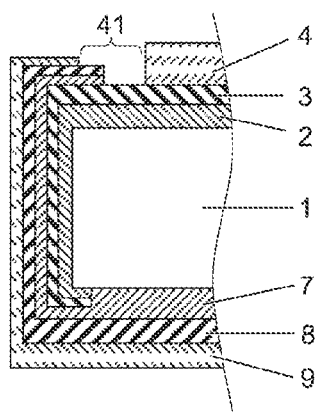
FIGS. 10A and 10B are schematic sectional views each showing a configuration in the vicinity of the peripheral portion of a silicon substrate in a crystalline silicon-based solar cell.
Figure 10B:
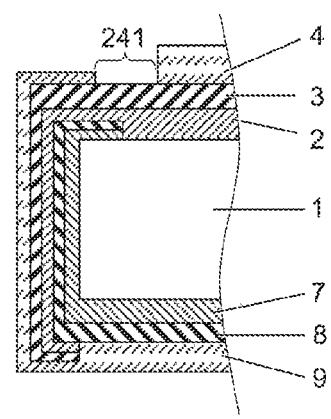

When the width of wraparound of the n-type silicon-based thin-film 8 to the first principal surface side of the n-type crystalline silicon substrate 1 is larger than the width of wraparound of the second transparent electrode layer 9, a stacking configuration of n-type crystalline silicon substrate 1/p-type silicon-based thin-film 3/n-type silicon-based thin-film 8 is formed in the insulating region 41 as shown in FIG. 10A when the p-type silicon-based thin-film 3 is deposited prior to the n-type silicon-based thin-film 8. On the other hand, when the n-type silicon-based thin-film 8 is deposited prior to the p-type silicon-based thin-film 3, a stacking configuration of n-type crystalline silicon substrate 1/n-type silicon-based thin-film 8/p-type silicon-based thin-film 3 is formed in the insulating region 241 as shown in FIG. 10B.

The stacking configuration including the structure of n-type crystalline silicon substrate 1/p-type silicon-based thin-film 3 is superior in barrier property against a current by the p-n junction to the stacking configuration including the structure of n-type silicon-based thin-film/p-type silicon-based thin-film 3. When the n-type silicon-based thin-film 8 is deposited prior to the p-type silicon-based thin-film 3, the plating metal may be precipitated in the insulating region. Thus, it is preferable to deposit the p-type silicon-based thin-film 3 prior to the n-type silicon-based thin-film 8 from the viewpoint of suppressing plating precipitation on the insulating region at the wraparound portion of the silicon-based thin-film.

DESCRIPTION OF REFERENCE CHARACTERS 1 n-type crystalline silicon substrate
2, 7 intrinsic silicon-based thin-film
3 p-type silicon-based thin-film
8 n-type silicon-based thin-film
4, 9 transparent electrode layer
10 first insulating layer
20 wraparound portion
21 plated metal electrode
25 plating base electrode
31 contaminant 33 exposed region
34 plated metal region
11 patterned collecting electrode
41 insulating region
51 first principal surface of n-type crystalline silicon substrate
52 second principal surface of n-type crystalline silicon substrate
100 solar cell
120 encapsulant
131, 132 protective material
150, 155 wiring member
200: solar cell module Although the disclosure has been described with respect to only a limited number of embodiments, those skilled in the art, having benefit of this disclosure, will appreciate that various other embodiments may be devised without departing from the scope of the present invention. Accordingly the scope of the invention should be limited only by the attached claims.

The invention claimed is:

1. A method for manufacturing a crystalline silicon-based solar cell, the method comprising:
    forming a first intrinsic silicon-based thin-film on a first principal surface and a lateral surface of an n-type crystalline silicon substrate, wherein the n-type crystalline silicon substrate comprises the first principal surface, a second principal surface, and the lateral surface;
    forming a p-type silicon-based thin-film on the first intrinsic silicon-based thin-film;
    forming a first transparent electrode layer on an entire region of the first principal surface except for a peripheral portion of the first principal surface;
    forming a second intrinsic silicon-based thin-film on the second principal surface and the lateral surface of the n-type crystalline silicon substrate;
    forming an n-type silicon-based thin-film on the second intrinsic silicon-based thin-film;
    forming a second transparent electrode layer on an entire region of the second principal surface and the lateral surface of the n-type crystalline silicon substrate;
    forming a patterned collecting electrode on the first transparent electrode layer; and
    forming a plated metal electrode on the second transparent electrode layer by an electroplating method in a state in which an insulating region is present on the peripheral portion of the first principal surface of the n-type crystalline silicon substrate, wherein
    neither the first transparent electrode layer nor the second transparent electrode layer is formed on the insulating region,
    the second intrinsic silicon-based thin-film is formed after the formation of the first intrinsic silicon-based thin-film, and
    a thickness $d_1$ of the patterned collecting electrode is larger than a thickness $d_2$ of the plated metal electrode.

2. The method according to claim 1, wherein the crystalline silicon-based solar cell comprises:
    the n-type crystalline silicon substrate;
    the first intrinsic silicon-based thin-film, the p-type silicon-based thin-film, the first transparent electrode layer, and the patterned collecting electrode arranged in this order on the first principal surface; and
    the second intrinsic silicon-based thin-film, the n-type silicon-based thin-film, the second transparent electrode layer, and the plated metal electrode arranged in this order on the second principal surface.

3. The method according to claim 1, wherein forming the n-type silicon-based thin-film is performed after the p-type silicon-based thin-film is formed.

4. The method according to claim 1, wherein forming the first transparent electrode layer is performed in a state in which a mask is disposed on the peripheral portion of the first principal surface of the n-type crystalline silicon substrate.

5. The method according to claim 1, wherein forming the second transparent electrode layer is performed without using a mask.

6. The method according to claim 1, wherein
    the p-type silicon-based thin-film is formed on the entire first principal surface and the lateral surface of the n-type crystalline silicon substrate without using a mask, and
    the n-type silicon-based thin-film is formed on the entire second principal surface and the lateral surface of the n-type crystalline silicon substrate without using a mask.

7. The method according to claim 1, further comprising forming a plating base electrode on the second transparent electrode layer,
    wherein forming the plating base electrode is performed after the second transparent electrode layer is formed and before the plated metal electrode is formed, and
    wherein the plated metal electrode is formed on the plating base electrode.

8. The method according to claim 7, wherein the plated metal electrode is formed by feeding electricity onto the plating base electrode.

9. The method according to claim 1, wherein the patterned collecting electrode is formed by electroplating.

10. The method according to claim 9, wherein forming the patterned collecting electrode and forming the plated metal electrode are performed simultaneously.

11. The method according to claim 9, further comprising, in the following order, before the formation of the patterned collecting electrode:
    forming a patterned seed electrode on the first transparent electrode layer; and
    forming a first insulating layer covering the first transparent electrode layer, wherein
    the first insulating layer is formed so as to have an opening section on at least a part of the seed electrode, and
    the patterned collecting electrode is formed through the opening section of the first insulating layer on the seed electrode by electroplating.

12. The method according to claim 1, further comprising forming a first insulating layer on the first transparent electrode layer after the first transparent electrode layer is formed and before the patterned collecting electrode is formed.

13. The method according to claim 1, further comprising forming a texture on a surface of the n-type crystalline silicon substrate and cleaning a surface of the texture, before the first intrinsic silicon-based thin-film and the second intrinsic silicon-based thin-film are formed.

14. The method according to claim 13, wherein the surface of the texture is cleaned by using ozone water.

15. The method according to claim 1, wherein
a plated metal region comprising a material of the plated metal electrode is formed in an island form on the insulating region during the formation of the plated metal electrode,
a thickness $d_A$ of the plated metal region is smaller than the thickness $d_1$ of the patterned collecting electrode, and
a width $W_1$ of the insulating region is larger than $2\,d_A$.

16. A method for manufacturing a crystalline silicon-based solar cell module, comprising:
manufacturing a solar cell by the method according to claim 15; and
mounting a wiring member on the patterned collecting electrode, wherein
the wiring member is arranged over the insulating region and is arranged separately from the plated metal region.

* * * * *